(12) United States Patent
Nomura et al.

(10) Patent No.: US 12,716,971 B2
(45) Date of Patent: Aug. 25, 2026

(54) MAGNETIC PARTICLE IMAGING APPARATUS

(71) Applicant: Mitsubishi Electric Corporation, Tokyo (JP)

(72) Inventors: Kota Nomura, Chiyoda-ku (JP); Tetsuya Matsuda, Chiyoda-ku (JP); Kazuki Yamauchi, Chiyoda-ku (JP)

(73) Assignee: MITSUBISHI ELECTRIC CORPORATION, Tokyo (JP)

(*) Notice: Subject to any disclaimer, the term of this patent is extended or adjusted under 35 U.S.C. 154(b) by 233 days.

(21) Appl. No.: 18/688,792

(22) PCT Filed: Sep. 14, 2021

(86) PCT No.: PCT/JP2021/033763
§ 371 (c)(1),
(2) Date: Mar. 4, 2024

(87) PCT Pub. No.: WO2023/042265
PCT Pub. Date: Mar. 23, 2023

(65) Prior Publication Data
US 2024/0369652 A1 Nov. 7, 2024

(51) Int. Cl.
*G01R 33/12* (2006.01)
*G01R 33/00* (2006.01)

(52) U.S. Cl.
CPC ..... *G01R 33/1276* (2013.01); *G01R 33/0029* (2013.01)

(58) Field of Classification Search
CPC ....................... G01R 33/1276; G01R 33/0029; G01R 33/12; A61B 5/055; A61B 5/0515
See application file for complete search history.

(56) References Cited

U.S. PATENT DOCUMENTS

2011/0037461 A1* 2/2011 Braun .................... G01N 27/87 324/240
2012/0126808 A1 5/2012 Knopp et al.

FOREIGN PATENT DOCUMENTS

JP 2010-088683 A 4/2010
JP 5767225 B2 8/2015
JP 2019-523115 A 8/2019
(Continued)

OTHER PUBLICATIONS

International Search Report and Written Opinion mailed on Nov. 2, 2021, received for PCT Application PCT/ JP2021/033763, filed on Sep. 14, 2021, 11 pages including English Translation.
(Continued)

*Primary Examiner* — Feba Pothen
(74) *Attorney, Agent, or Firm* — XSENSUS LLP

(57) ABSTRACT

The magnetic particle imaging apparatus includes: a retaining unit configured to retain an inspection target; a static magnetic field generator configured to generate a linear magnetic field-free region that passes through the inspection target retained by the retaining unit; an AC magnetic field application coil configured to apply an AC magnetic field to the magnetic field-free region; and a detection coil configured to detect a magnetic variation of magnetic particles in the magnetic field-free region as a signal. The retaining unit, the AC magnetic field application coil and the detection coil are movable relative to the static magnetic field generator in the third direction as an integral structure.

20 Claims, 6 Drawing Sheets

(56) References Cited

FOREIGN PATENT DOCUMENTS

| | | | |
|---|---|---|---|
| JP | 2019-527606 | A | 10/2019 |
| WO | 2018/013731 | A1 | 1/2018 |
| WO | 2018/013738 | A1 | 1/2018 |

OTHER PUBLICATIONS

Murase et al., "Development of a system for magnetic particle imaging using neodymium magnets and gradiometer", Japanese Journal of Applied Physics, 2014, vol. 53, 8 pages.

* cited by examiner

100
II
FFL
2
3B(3)
S
N
7
3A(3)
4B(4)
5
21
AX1,AX3,AX4
6
1
S
22
4A(4)
23
N
S
2
II
C
A
B

MAGNETIC PARTICLE IMAGING APPARATUS

CROSS-REFERENCE TO RELATED APPLICATION

This application is based on PCT filing PCT/JP2021/033763, filed Sep. 14, 2021, the entire contents of which are incorporated herein by reference.

TECHNICAL FIELD

The present disclosure relates to a magnetic particle imaging apparatus.

BACKGROUND ART

There is known a magnetic particle imaging (MPI) apparatus that images a distribution of magnetic particles (for example, superparamagnetic iron oxide) injected into an inspection target.

In a magnetic particle imaging apparatus, a linear magnetic field-free region (FFL: Field Free Line) is formed to pass through a partial region of an inspection target, and an AC magnetic field is applied to the magnetic field-free region. If there are magnetic particles present in the magnetic field-free region of the inspection target, the magnetization of the magnetic particles fluctuates periodically in response to the AC magnetic field, which generates an induced electromotive force in the detection coil arranged around the inspection target. As a result, the magnetic particles in the magnetic field-free region are detected by the detection coil as an induced electromotive force generated in the detection coil or a change thereof.

In the magnetic particle imaging apparatus, the distribution of magnetic particles in the inspection target may be imaged by moving one of the inspection target and the magnetic field-free region relative to the other.

There is known a magnetic particle imaging apparatus in which an inspection target and a detection coil are moved (scanned) as an integral structure with respect to a magnetic field-free region and an AC magnetic field (For example, Kenya Murase et al., Japanese Journal of Applied Physics 53, 0670001 (2014)) (NPL 1).

CITATION LIST

Non Patent Literature

NPL 1: Kenya Murase et al., "Development of a system for magnetic particle imaging using neodymium magnets and gradiometer", Japanese Journal of Applied Physics 53, 067001 (2014)

SUMMARY OF INVENTION

Technical Problem

In the magnetic particle imaging apparatus described in the NPL 1, if the relative position of each of the inspection target and the detection coil relative to the magnetic field-free region and the AC magnetic field is changed, the detection sensitivity of the magnetic particles changes largely in response to the relative position. In other words, in the magnetic particle imaging apparatus described in the NPL 1, the position dependency of the detection sensitivity of the magnetic particles is high.

A main object of the present disclosure is to provide a magnetic particle imaging apparatus with a reduced position dependency of the detection sensitivity of magnetic particles as compared with a conventional magnetic particle imaging apparatus.

Solution to Problem

The magnetic particle imaging apparatus according to an embodiment of the present disclosure includes: a retaining unit configured to retain an inspection target; a static magnetic field generator configured to generate a linear magnetic field-free region that passes through the inspection target retained by the retaining unit; an AC magnetic field application coil configured to apply an AC magnetic field to the magnetic field-free region; and a detection coil configured to detect a magnetic variation of the magnetic particles in the magnetic field-free region as a signal. The detection coil has an axis parallel to the direction of the AC magnetic field. The relative position of each of the retaining unit, the AC magnetic field application coil and the detection coil is fixed in a direction orthogonal to both the extending direction of the axis and the extending direction of the magnetic field-free region. The retaining unit, the AC magnetic field application coil and the detection coil are movable as an integral structure in a direction orthogonal to the static magnetic field generator.

Advantageous Effects of Invention

According to the present disclosure, it is possible to provide a magnetic particle imaging apparatus with a reduced position dependency of the detection sensitivity of magnetic particles as compared with a conventional magnetic particle imaging apparatus.

DESCRIPTION OF EMBODIMENTS

Figure 1:
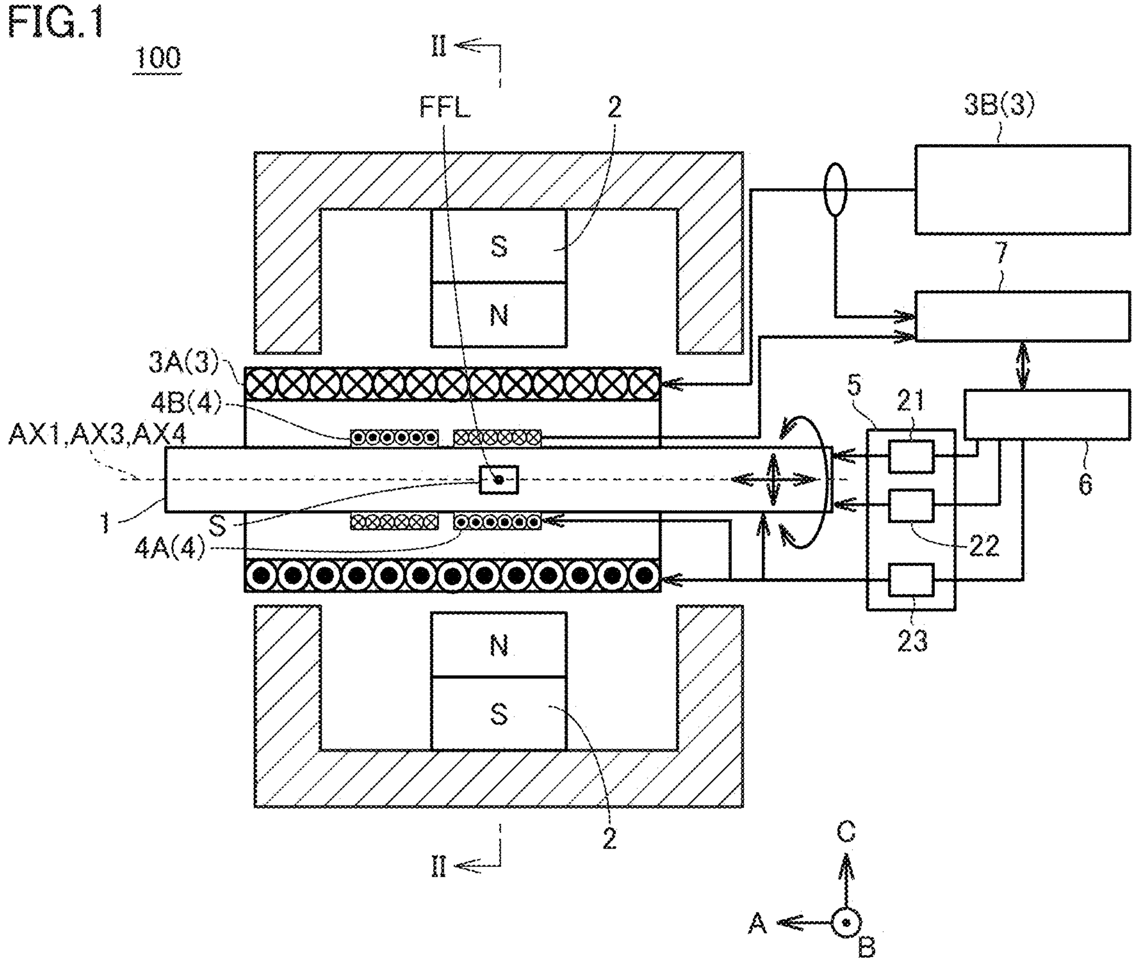
FIG. 1 is a diagram illustrating a magnetic particle imaging apparatus according to a first embodiment.

Hereinafter, embodiments of the present disclosure will be described with reference to the drawings. In the following drawings, the same or corresponding portions will be denoted by the same reference numerals, and the description thereof will not be repeated. For the convenience of explanation, an orthogonal coordinate system having a first direction A, a second direction B, and a third direction C orthogonal to each other is illustrated in each of the drawings.

When expressions denoting a geometric relationship, a positional relationship and/or a directional relationship such as "parallel", "orthogonal", "coaxial", and "along" are used in the present disclosure, these expressions allow for a manufacturing error or a small deviation.

First Embodiment

A magnetic particle imaging apparatus 100 according to a first embodiment illustrated in FIGS. 1 to 4 is configured to utilize a linear magnetic field-free region FFL (hereinafter also referred to as FFL) that passes through an inspection target S to perform magnetic particle imaging (hereinafter simply referred to as MPI). In the present embodiment, MPI means to detect whether or not magnetic particles (for example, superparamagnetic iron oxide or the like) are present in the magnetic field-free region FFL that passes through the inspection target S, or to image the distribution of magnetic particles in a specific region of the inspection target S by performing the above-described detection while changing the position of the magnetic field-free region FFL relative to the inspection target S.

As illustrated in FIGS. 1 to 4, the magnetic particle imaging apparatus 100 includes a fixed unit (retaining unit) 1, a static magnetic field generator 2, an AC magnetic field applicator 3, a detection coil 4, a driving mechanism 5, a controller 6, and a detection unit 7.

The retaining unit 1 is configured to retain the inspection target S. The retaining unit 1 is, for example, a cylindrical member that houses the inspection target S. The retaining unit 1 has a central axis AX1 extending along a first direction A. The inspection target S is, for example, a human or an animal.

The static magnetic field generator 2 is configured to generate a linear magnetic field-free region FFL that passes through the inspection target S retained by the retaining unit 1. The magnetic field-free region FFL is ideally a region where the intensity of the static magnetic field is zero. The magnetic field-free region FFL may be a region in which saturation of the static magnetic field does not occur at least when the AC magnetic field is not applied by the AC magnetic field applicator 3. The intensity of the static magnetic field in the magnetic field-free region FFL may be greater than zero. The magnetic field-free region FFL extends along the second direction B. The linear magnetic field-free region FFL is ideally a linear magnetic field-free region, but it may be a substantially cylindrical region having a width in the radial direction relative to the extending direction.

Figure 2:
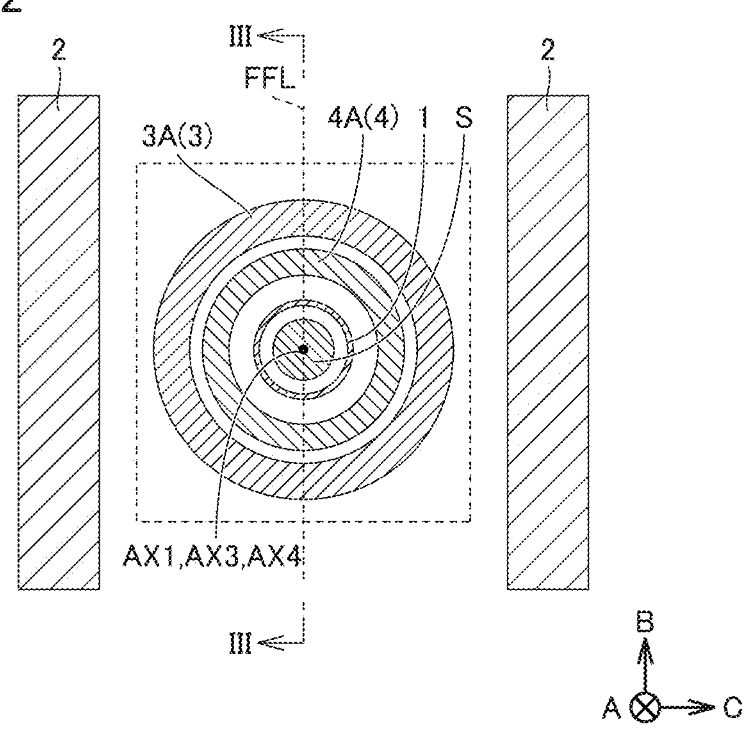
FIG. 2 is a cross-sectional view taken along an arrow II-II in FIG. 1.

As illustrated in FIGS. 1 and 2, the static magnetic field generator 2 includes, for example, two permanent magnets arranged in such a manner that the same magnetic poles face each other. The magnetic poles of the two permanent magnets are arranged in the third direction C. The two permanent magnets of the static magnetic field generator 2 are arranged at intervals in the third direction C. The two permanent magnets are disposed so as to sandwich the retaining unit 1, the AC magnetic field application coil 3A of the AC magnetic field applying device 3 and the detection coil 4 in the third direction C. The two permanent magnets are configured to generate a magnetic field-free region FFL between the two permanent magnets at a central position in the third direction C.

The static magnetic field generator 2 may be formed of, for example, two electromagnets.

The AC magnetic field applicator 3 includes an AC magnetic field application coil 3A and an AC power source 3B. The AC magnetic field application coil 3A is configured to apply an AC magnetic field to the magnetic field-free region FFL. In other words, the AC magnetic field application coil 3A is configured to change the magnetization of the magnetic particles in the magnetic field-free region FFL. The AC magnetic field application coil 3A is connected to the AC power source 3B. The AC magnetic field application coil 3A is provided in such a manner that the direction of the AC magnetic field is identical to the first direction A.

Figure 3:
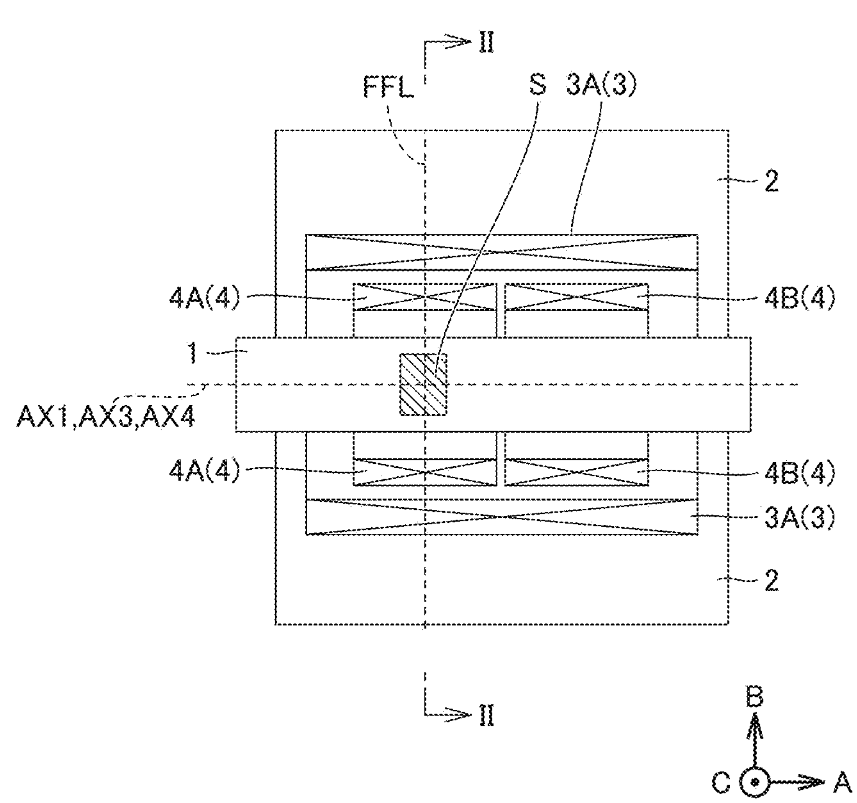
FIG. 3 is a cross-sectional view taken along an arrow III-III in FIG. 2.
Figure 4:
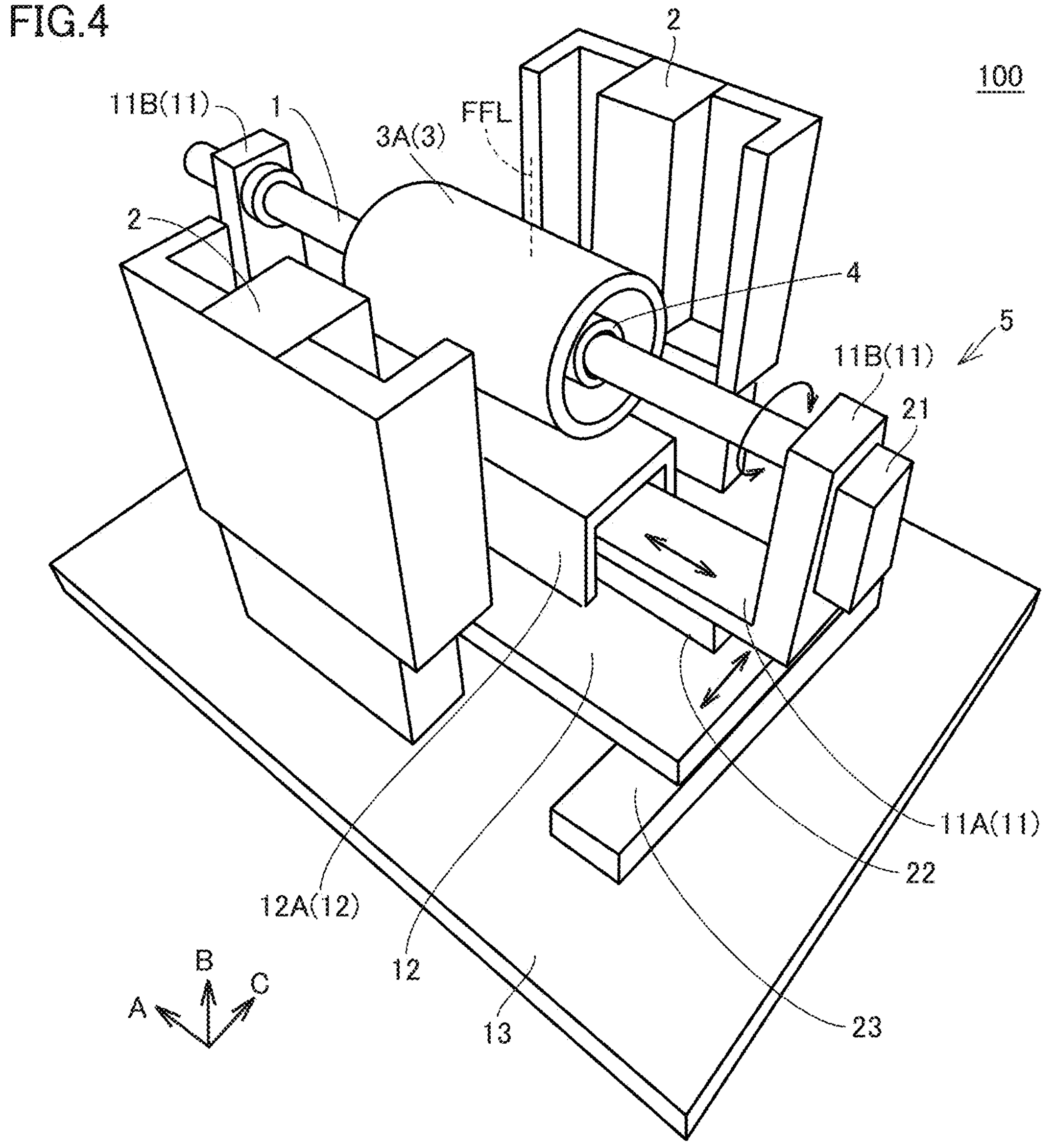
FIG. 4 is a diagram illustrating a driving mechanism of the magnetic particle imaging apparatus according to the first embodiment.

As illustrated in FIGS. 1 and 3, the AC magnetic field application coil 3A has a central axis AX3 extending in the first direction A. The AC magnetic field application coil 3A is disposed outside the retaining unit 1 in the radial direction of the central axis AX3, and is wound around the retaining unit 1. The AC magnetic field application coil 3A is disposed between two permanent magnets of the static magnetic field generator 2 in the third direction C, for example. The AC magnetic field application coil 3A is formed as, for example, a solenoid coil.

The detection coil 4 is configured to detect a magnetic variation of the magnetic particles in the magnetic field-free region FFL that passes through the inspection target S as a signal. The detection coil 4 has a central axis AX4 parallel to the direction of the AC magnetic field. The central axis AX4 extends in the first direction A. The detection coil 4 is disposed outside the retaining unit 1 and inside the AC magnetic field application coil 3A in the radial direction of the central axis AX4. The AC magnetic field application coil 3A and the detection coil 4 are disposed coaxially, for example. The central axis AX3 of the AC magnetic field application coil 3A is disposed to overlap with the central axis AX4 of the detection coil 4. Each of the central axes AX3 and AX4 is disposed to overlap with the central axis AX1 of the retaining unit 1.

As illustrated in FIG. 3, the detection coil 4 includes, for example, a first coil unit 4A and a second coil unit 4B. The first coil unit 4A and the second coil unit 4B are electrically symmetrical to each other with respect to the center of the AC magnetic field application coil 3A in the first direction A. In other words, the first coil unit 4A and the second coil unit 4B are disposed so as to eliminate an induced electromotive force generated by the AC magnetic field which is applied to the detection coil 4 by the AC magnetic field application coil 3A and any magnetic noise in the environment. Specifically, for example, the first coil unit 4A and the second coil unit 4B are electrically connected in series with each other and are disposed in plane symmetry with respect to the center of the AC magnetic field application coil 3A in the first direction A. The first coil unit 4A and the second coil unit 4B have the same configuration (the number of coil turns, the coil radius, and the like). The first coil unit 4A and the second coil unit 4B are disposed coaxially (with respect to the central axis AX4). Each of the first coil unit 4A and the second coil unit 4B is formed as, for example, a solenoid coil.

Each of the first coil unit 4A and the second coil unit 4B of the detection coil 4 is wound around the retaining unit 1. At least a part of the first coil unit 4A is disposed to overlap with the inspection target S retained by the retaining unit 1 in the radial direction of the central axis AX4. The entire second coil unit 4B is disposed not to overlap with the inspection target S retained by the retaining unit 1 in the radial direction of the central axis AX4.

Each of the first coil unit 4A and the second coil unit 4B of the detection coil 4 is disposed inside the AC magnetic field application coil 3A. Each of the first coil unit 4A and the second coil unit 4B of the detection coil 4 is disposed between two permanent magnets of the static magnetic field generator 2 in the third direction C.

The driving mechanism 5 drives the retaining unit 1, the AC magnetic field application coil 3A and the detection coil 4. The driving mechanism 5 includes a first stage 11, a second stage 12, a first driving unit 21, a second driving unit 22, and a third driving unit 23.

The first stage 11 supports the retaining unit 1 so as to be rotatable around the central axis AX1. The retaining unit 1 is supported by the first stage 11 so as to be rotatable around the central axis AX1. The first stage 11 includes, for example, a first portion 11A extending in the first direction A, and a pair of second portions 11B extending in the second direction B from both ends of the first portion in the first direction A. The pair of second portions 11B is configured to support both ends of the retaining unit 1 in the first direction A. The first driving unit 21 for rotating the retaining unit 1 around the central axis AX1 is fixed to at least one of the second portions 11B.

The second stage 12 supports the first stage 11 so as to be movable in the first direction A. The first stage 11 is supported by the second stage 12 so as to be movable in the first direction A. The first stage 11 is configured to move only in the first direction A relative to the second stage 12. The second stage 12 is provided with, for example, an annular portion 12A, through which the first portion 11A of the first stage 11 is inserted. The AC magnetic field application coil 3A and the detection coil 4 are fixed to the annular portion 12A of the second stage 12. The second driving unit 22 for moving the first stage 11 in the first direction A is fixed to the second stage 12.

The gantry 13 supports the second stage 12 so as to be movable in the third direction C. The second stage 12 is supported by the gantry 13 so as to be movable in the third direction C. The static magnetic field generator 2 is fixed to the gantry 13. The third driving unit 23 for moving the second stage 12 in the third direction C is fixed to the gantry 13.

The driving mechanism 5 moves each of the retaining unit 1, the static magnetic field generator 2, the AC magnetic field application coil 3A and the detection coil 4 in the following manner.

The relative position of each of the static magnetic field generator 2, the AC magnetic field application coil 3A and the detection coil 4 is fixed in the first direction A. The retaining unit 1 is movable relative to each of the static magnetic field generator 2, the AC magnetic field application coil 3A and the detection coil 4 in the first direction A. Among the retaining unit 1, the AC magnetic field application coil 3A and the detection coil 4, only the retaining unit 1 is movable in the first direction A.

The relative position of each of the retaining unit 1, the AC magnetic field application coil 3A and the detection coil 4 is fixed in the second direction B. The relative position of each of the retaining unit 1, the static magnetic field generator 2, the AC magnetic field application coil 3A and the detection coil 4 is fixed in the second direction B.

The relative position of each of the retaining unit 1, the AC magnetic field application coil 3A and the detection coil 4 is fixed in the third direction C. The retaining unit 1, the AC magnetic field application coil 3A and the detection coil 4 are movable relative to the static magnetic field generator 2 in the third direction C as an integral structure.

The position of the detection coil 4 relative to the AC magnetic field application coil 3A is fixed in the circumferential direction of the central axis AX1. Among the retaining unit 1, the AC magnetic field application coil 3A and the detection coil 4, only the retaining unit 1 is movable (rotatable) in the circumferential direction of the central axis AX1.

The controller 6 is connected to each of the first driving unit 21, the second driving unit 22 and the third driving unit 23 of the driving mechanism 5 so as to control each of the first driving unit 21, the second driving unit 22 and the third driving unit 23 of the driving mechanism 5. The controller 6 controls the position of the inspection target S relative to the magnetic field-free region FFL.

The detection unit 7 is connected to the detection coil 4. The detection unit 7 detects a signal acquired by the detection coil 4. The detection unit 7 is configured to detect whether or not magnetic particles are present in the magnetic field-free region FFL that passes through the inspection target S, or to image the distribution of the magnetic particles in a specific region of the inspection target S by performing the above-described detection while changing the position of the magnetic field-free region FFL relative to the inspection target S. The detection unit 7 includes, for example, a lock-in amplifier. The lock-in amplifier is connected to the AC power source 3B of the AC magnetic field applicator 3, and the lock-in amplifier is input with a reference signal having the same frequency and phase as the AC magnetic field. The lock-in amplifier extracts a signal of the magnetic particles from a detection signal input from the detection coil 4 based on the reference signal, and outputs the extracted signal.

Example Usage of Magnetic Particle Imaging Apparatus

The magnetic particle imaging apparatus 100 is used in the MPI mentioned above. The magnetic particle imaging apparatus 100 may be used in the following manner to detect whether or not magnetic particles are present in the linear magnetic field-free region FFL that passes through the inspection target S.

First is to determine a region to be detected in the inspection target S. Accordingly, the position of the retaining unit 1 relative to the magnetic-free region FFL in the first direction A and the third direction C and the angle of the retaining unit 1 relative to the magnetic-free region FFL in the circumferential direction of the central axis AX1 are determined.

Next is to achieve the determined relative position and the relative angle. Specifically, the retaining unit 1, the AC magnetic field application coil 3A and the detection coil 4 are moved relative to the static magnetic field generator 2 in the third direction C as an integral structure. The retaining unit 1 is moved relative to the static magnetic field generator 2 in the first direction A, the AC magnetic field application coil 3A and the detection coil 4, and then is moved (rotated) in the circumferential direction.

Next is to perform the detection. Specifically, the AC magnetic field application coil 3A is energized, and an AC magnetic field is applied to the magnetic field-free region FFL. If the magnetic particles are present in the magnetic field-free region FFL, the magnetization of the magnetic particles is varied by the AC magnetic field, and an induced electromotive force is generated in the detection coil 4 in accordance with the magnetic variation. On the other hand, if the magnetic particles are not present in the magnetic field-free region FFL, no induced electromotive force is generated in the detection coil 4 in accordance with the magnetic variation of the magnetic particles. As a result, in the magnetic particle imaging apparatus 100, the magnetic particles present in the magnetic field-free region FFL are detected as an induced electromotive force generated in the detection coil 4 or a change thereof.

In the case of imaging the distribution of the magnetic particles in the inspection target S, the magnetic particle imaging apparatus 100 may be used basically in the same procedure as in the case of detecting whether or not the magnetic particles are present in the linear magnetic field-free region FFL that passes through the inspection target, but the above-described detection is performed while changing the position of the magnetic field-free region FFL relative to the inspection target S (the position of the magnetic field-free region FFL relative to the inspection target S in the first direction A and the third direction C or the angle of the magnetic field-free region FFL relative to the inspection target S in the circumferential direction).

Effects

The intensity of the AC magnetic field applied to the magnetic field-free region FFL by the AC magnetic field application coil varies in response to the position of the magnetic field-free region FFL relative to the AC magnetic field application coil. In other words, the intensity of the AC magnetic field applied to the magnetic field-free region FFL by the AC magnetic field application coil exhibits a spatial distribution. Even if the intensity of the AC magnetic field applied to the magnetic field-free region FFL by the AC magnetic field application coil is uniform with respect to the position of the magnetic field-free region FFL relative to the AC magnetic field application coil, the detection sensitivity of the magnetic variation of the magnetic particles by the detection coil varies in response to the position of the magnetic particles (the magnetic field-free region FFL) relative to the detection coil. In other words, the detection sensitivity of the detection coil also exhibits a spatial distribution.

Therefore, as described above, in the magnetic particle imaging apparatus of the comparative example in which the position of each of the inspection target and the detection coil relative to the magnetic field-free region and the AC magnetic field varies, the detection sensitivity of the magnetic particles varies in response to the position of the magnetic field-free region FFL relative to each of the AC magnetic field application coil and the detection coil due to the superposition between the spatial distribution of the AC magnetic field application coil and the spatial distribution of the detection coil.

On the other hand, in the magnetic particle imaging apparatus 100, the relative position of each of the retaining unit 1, the AC magnetic field application coil 3A and the detection coil 4 is fixed in both the second direction B and the third direction C. The retaining unit 1, the AC magnetic field application coil 3A and the detection coil 4 are movable relative to the static magnetic field generator 2 in the third direction C as an integral structure. Therefore, in the magnetic particle imaging apparatus 100, the position dependency of the detection sensitivity of the magnetic particles is reduced as compared with the magnetic particle imaging apparatus according to the comparative example.

In the magnetic particle imaging apparatus according to the comparative example, if the inspection target and the detection coil are subjected to vibration or rattling when the inspection target and the detection coil are being moved relative to the AC magnetic field application coil, the position of each of the inspection target and the detection coil relative to the stationary AC magnetic field application coil and the AC magnetic field varies, and thereby, an induced electromotive force is generated by the vibration or rattling in the detection coil. Therefore, in the magnetic particle imaging apparatus according to the comparative example, since the vibration or rattling of the inspection target and the detection coil is detected as noise, it is difficult to increase the detection accuracy.

On the other hand, in the magnetic particle imaging apparatus 100, since the retaining unit 1, the AC magnetic field application coil 3A and the detection coil 4 are movable in the third direction C as an integral structure, even if the retaining unit 1, the AC magnetic field application coil 3A and the detection coil 4 are subjected to vibration or rattling as an integral structure, the relative position of each of the inspection target S, the AC magnetic field application coil 3A and the detection coil 4 does not change, and thereby no induced electromotive force will be generated by the vibration or rattling in the detection coil 4. Therefore, in the magnetic particle imaging apparatus 100, since the vibration or rattling applied to the inspection target S, the AC magnetic field application coil 3A and the detection coil 4 (which are movable as an integral structure) is not detected as noise, and thereby the detection accuracy of the magnetic particles will be increased as compared with the magnetic particle imaging apparatus according to the comparative example.

Further, in the magnetic particle imaging apparatus 100, the retaining unit 1, the AC magnetic field application coil 3A and the detection coil 4 are configured to be movable in the third direction C as an integral structure but not movable in the first direction A as an integral structure. Therefore, in the magnetic particle imaging apparatus 100, the position dependency of the detection sensitivity of the magnetic particles is reduced as compared with a magnetic particle imaging apparatus in which the retaining unit 1, the AC magnetic field application coil 3A and the detection coil 4 are configured to be movable as an integral structure in both the first direction A and the third direction C. The reason for this will be described below with reference to FIGS. 5 and 6.

Figure 5:
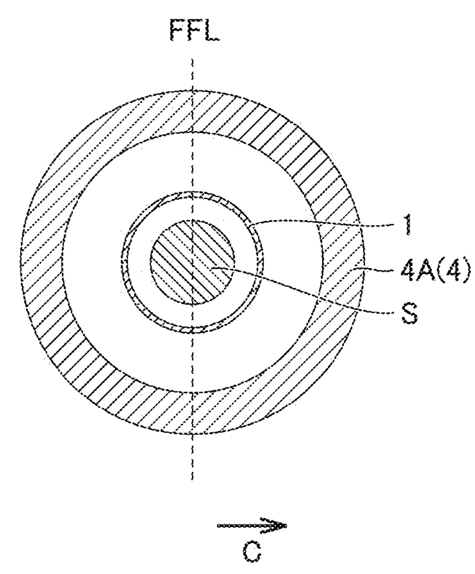
FIG. 5 is a diagram illustrating the sensitivity distribution in the radial direction of a detection coil in the magnetic particle imaging apparatus illustrated in FIGS. 1 to 3.
Figure 5:
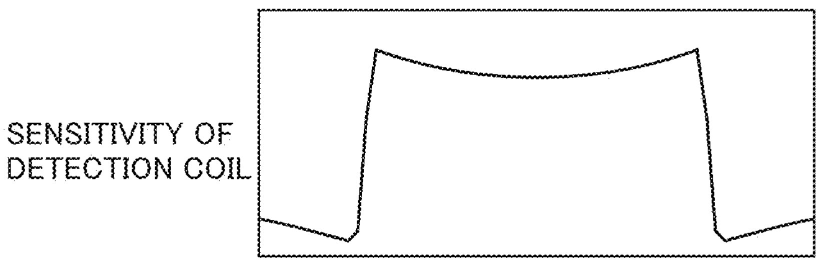
Figure 6:
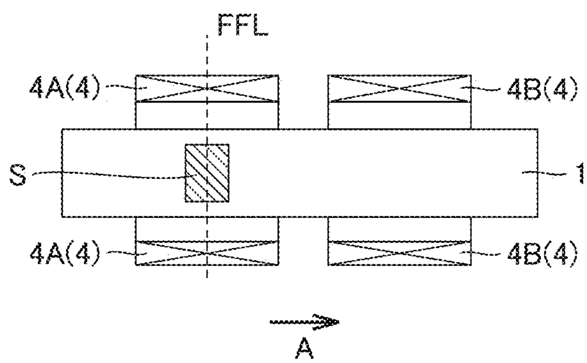
FIG. 6 is a diagram illustrating the sensitivity distribution in the axial direction of the detection coil in the magnetic particle imaging apparatus illustrated in FIGS. 1 to 3.
Figure 6:
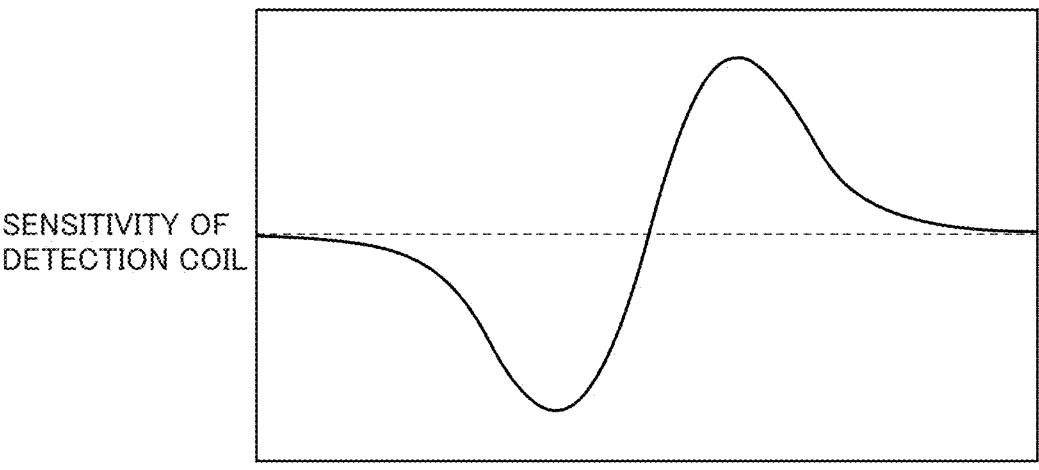

FIG. 5 is a diagram illustrating a sensitivity distribution of the detection coil 4 in the radial direction relative to the central axis AX4 of the detection coil 4. The upper part of FIG. 5 illustrates a cross section of the detection coil 4 perpendicular to the central axis AX4. The lower part of FIG. 5 illustrates the sensitivity distribution of the detection coil 4 relative to the magnetic particles in the magnetic field-free region FFL at each position when the position of the magnetic field-free region FFL relative to the detection coil 4 in the radial direction is changed as illustrated in the cross section in the upper part of FIG. 5. FIG. 6 is a diagram illustrating a sensitivity distribution of the detection coil 4 in the direction of the central axis AX4 of the detection coil 4. The upper part of FIG. 6 illustrates a cross section of the detection coil 4 in the direction of the central axis AX4. The lower part of FIG. 6 illustrates the sensitivity distribution of the detection coil 4 relative to the magnetic particles in the magnetic field-free region FFL at each position when the position in the axial direction of the magnetic field-free region FFL relative to the detection coil 4 is changed as illustrated in the cross section in the upper part of FIG. 6. The sensitivity distribution of the detection coil 4 illustrated in FIGS. 5 and 6 may be obtained analytically or experimentally.

As illustrated in FIG. 5, even if the position of the magnetic field-free region FFL relative to the detection coil 4 in the radial direction is changed, the detection sensitivity of the detection coil 4 does not change largely. In other words, the change rate of the sensitivity distribution of the detection coil 4 in the radial direction is relatively low. On the other hand, as illustrated in FIG. 6, when the position of the magnetic field-free region FFL relative to the detection coil 4 in the axial direction is changed, the detection sensitivity of the detection coil 4 changes largely. This is because the detection coil 4 includes a first coil unit 4A and a second coil unit 4B, and the detection sensitivity of the detection coil 4 is inverted at a middle point between the first coil unit 4A and the second coil unit 4B in the axial direction. In other words, the change rate of the sensitivity distribution of the detection coil 4 in the axial direction is higher than the change rate of the sensitivity distribution of the detection coil 4 in the radial direction.

Therefore, in the magnetic particle imaging apparatus 100, since the retaining unit 1, the AC magnetic field application coil 3A and the detection coil 4 are movable relative to the magnetic field-free region FFL as an integral structure in the third direction C but are not movable relative to the magnetic field-free region FFL in the first direction A as an integral structure, as compared with a magnetic particle imaging apparatus in which the retaining unit 1, the AC magnetic field application coil 3A and the detection coil 4 are movable as an integral structure in both the first direction A and the third direction C, the position dependency of the detection sensitivity of the magnetic particles is reduced.

As described above, the sensitivity distribution of the detection coil 4 illustrated in FIGS. 5 and 6 can be obtained analytically or experimentally if the relative position between the detection coil 4 and the magnetic field-free region FFL is fixed. From the analytically or experimentally obtained sensitivity distribution of the measuring coil 4, the increase/decrease ratio in the intensity of the signal acquired by the measuring coil 4 due to the sensitivity distribution can be calculated. In the magnetic particle imaging apparatus 100, the detection unit 7 can normalize the intensity of the signal acquired by the detection coil 4 based on the increase/decrease ratio calculated as described above. Thus, the spatial distribution of the magnetic particles in the inspection target S can be quantitatively evaluated by using the magnetic particle imaging apparatus 100. In other words, the magnetic particle imaging apparatus 100 is excellent in quantitation.

In the magnetic particle imaging apparatus 100, the central axis AX4 of the detection coil 4 is orthogonal to the linear magnetic field-free region FFL. Therefore, in the magnetic particle imaging apparatus 100, it is possible to easily control the position of the inspection target S relative to the magnetic field-free region FFL by moving the retaining unit 1, the AC magnetic field application coil 3A and the detection coil 4 relative to the magnetic field-free region FFL as an integral structure in the third direction C and moving only the retaining unit 1 in the first direction A and rotating the same in the circumferential direction, without moving each of the retaining unit 1, the AC magnetic field application coil 3A and the detection coil 4 relative to the magnetic field-free region FFL in the second direction B in which the magnetic field-free region FFL extends.

In the magnetic particle imaging apparatus 100, since the detection coil 4 includes the first coil unit 4A and the second coil unit 4B arranged at intervals in the first direction A, and the first coil unit 4A and the second coil unit 4B are electrically symmetrical to each other with respect to the center of the AC magnetic field application coil 3A in the first direction A, it is possible to eliminate the induced electromotive force generated in the detection coil 4 by the AC magnetic field generated by the AC magnetic field application coil 3A and the magnetic noise in the environment.

The static magnetic field generator 2 includes two permanent magnets arranged in such a manner that the same magnetic poles face each other. The magnetic field-free region formed by electromagnets or the like may fluctuate in response to an energization condition or the like. As compared with the magnetic field-free region formed by the electromagnets or the like, the magnetic field-free region FFL formed by the permanent magnets is less likely to fluctuate. Therefore, when the static magnetic field generator 2 includes two permanent magnets, the magnetic particle imaging apparatus 100 described above exhibits significant effects.

In the magnetic particle imaging apparatus 100, since only the retaining unit 1 is movable (rotatable) in the circumferential direction, as compared with the case where the retaining unit 1 is rotatable in the circumferential direction together with at least one of the AC magnetic field application coil 3A and the detection coil 4, it is possible to make the driving mechanism 5 simple, and it is also possible to reduce the occurrence of entanglement of wires connected to the AC magnetic field application coil 3A and the detection coil 4.

Second Embodiment

Figure 7:
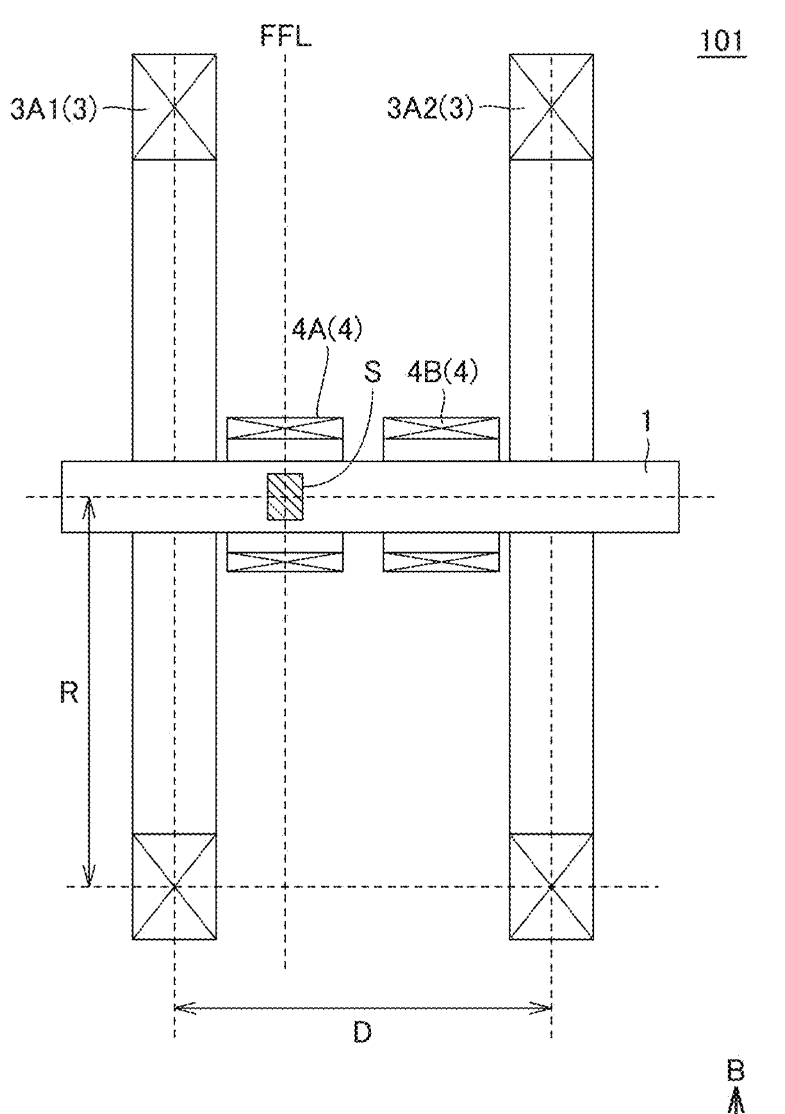
FIG. 7 is a cross-sectional view illustrating a magnetic particle imaging apparatus according to a second embodiment.

As illustrated in FIG. 7, a magnetic particle imaging apparatus 101 according to a second embodiment has basically the same configuration as the magnetic particle imaging apparatus 100 according to the first embodiment, but is different from the magnetic particle imaging apparatus 100 in that the AC magnetic field application coil 3A is formed of a Helmholtz coil. In the following, the main difference between the magnetic particle imaging apparatus 101 and the magnetic particle imaging apparatus 100 will be described.

The AC magnetic field application coil 3A includes a first coil 3A1 and a second coil 3A2 which have the same configuration (the number of coil turns, the coil radius, and the like) and disposed coaxially. The radius R of the first coil 3A1 is equal to the radius R of the second coil 3A2, and is equal to a distance D between the first coil 3A1 and the second coil 3A2. Thereby, the intensity of the AC magnetic field around the center of a space sandwiched between the first coil 3A1 and the second coil 3 A2 becomes uniform.

The first coil 3A1 and the second coil 3A2 of the AC magnetic field application coil 3A are disposed relative to the detection coil 4 in such a manner that the center between the first coil 3A1 and the second coil 3A2 in the first direction A overlaps with the center between the first coil unit 4A and the second coil unit 4B of the detection coil 4 in the first direction A. Therefore, it is possible to reduce the position dependency of the signal intensity of the magnetic particles acquired by the detection coil 4 in the magnetic particle imaging apparatus 101 due to the intensity distribution of the AC magnetic field as compared with the signal intensity of the magnetic particles acquired by the detection coil 4 in the magnetic particle imaging apparatus 100.

Modification

In the case where the magnetic particle imaging apparatuses 100 or 101 is only used to detect whether or not magnetic particles are present in the magnetic field-free region FFL that passes through the inspection target S, the retaining unit 1 may not be configured to be rotatable around the central axis AX1. Also in this case, as long as the retaining unit 1, the AC magnetic field application coil 3A and the detection coil 4 are movable relative to the static magnetic field generator 2 as an integral structure in the third direction C, it is possible to reduce the position dependency of the detection sensitivity of the magnetic particles as compared with the conventional magnetic particle imaging apparatus.

In the magnetic particle imaging apparatuses 100 and 101, the retaining unit 1, the AC magnetic field application coil 3A and the detection coil 4 may be fixed as an integral structure, and the static magnetic field generator 2 may be configured to be movable relative to the retaining unit 1, the AC magnetic field application coil 3A and the detection coil 4 which are fixed as an integral structure in the third direction C. The retaining unit 1 is movable, for example, in the first direction A and rotatable around the central axis AX1. As described above, the retaining unit 1 may not be configured to be rotatable around the central axis AX1.

Although the embodiments of the present disclosure have been described above, the above-described embodiments may be modified in various ways. The scope of the present disclosure is not limited to the above-described embodiments. The scope of the present disclosure is defined by the claims, and is intended to include any modifications within the meaning and scope equivalent to the claims.

REFERENCE SIGNS LIST

1: retaining unit; 2: static magnetic field generator; 3: AC magnetic field applicator; 3A: AC magnetic field application coil; 3A1: first coil; 3A2: second coil; 3B: AC power supply; 4: detection coil; 4A: first coil unit; 4B: second coil unit; 5: driving mechanism; 6: controller; 7: detection unit; 11: first stage; 11A: first portion; 11B: second portion; 12: second stage; 12A: annular portion; 13: gantry; 21: first driving unit; 22: second driving unit; 23: third driving unit; 100, 101: magnetic particle imaging apparatus

The invention claimed is:

1. A magnetic particle imaging apparatus configured to detect magnetic particles in an inspection target, comprising:
- a retaining unit configured to retain the inspection target;
- a static magnetic field generator configured to generate a linear magnetic field-free region that passes through the inspection target retained by the retaining unit;
- an AC magnetic field application coil configured to apply an AC magnetic field to the magnetic field-free region; and
- a detection coil configured to detect a magnetic variation of the magnetic particles in the magnetic field-free region as a signal,
- the detection coil having an axis parallel to the direction of the AC magnetic field,
- the relative position of each of the retaining unit, the AC magnetic field application coil and the detection coil being fixed in a direction orthogonal to both the extending direction of the axis and the extending direction of the magnetic field-free region, and
- the retaining unit, the AC magnetic field application coil and the detection coil being movable relative to the static magnetic field generator in the orthogonal direction as an integral structure.

2. The magnetic particle imaging apparatus according to claim 1, wherein
- the position of the detection coil relative to the AC magnetic field application coil is fixed in a circumferential direction of the axis, and
- among the retaining unit, the AC magnetic field application coil and the detection coil, only the retaining unit is movable in the circumferential direction.

3. A magnetic particle imaging apparatus configured to detect magnetic particles in an inspection target, comprising:
- a retaining unit configured to retain the inspection target;
- a static magnetic field generator configured to generate a linear magnetic field-free region that passes through the inspection target retained by the retaining unit;
- an AC magnetic field application coil configured to apply an AC magnetic field to the magnetic field-free region; and
- a detection coil configured to detect a magnetic variation of the magnetic particles in the magnetic field-free region as a signal,
- the detection coil having an axis parallel to the direction of the AC magnetic field,
- the position of the detection coil relative to the AC magnetic field application coil being fixed in a circumferential direction of the axis,
- among the retaining unit, the AC magnetic field application coil and the detection coil, only the retaining unit being movable in the circumferential direction, and
- the retaining unit, the AC magnetic field application coil and the detection coil are movable, as an integral structure, relative to the static magnetic field generator in an orthogonal direction to both the extending direction of the axis and the extending direction of the magnetic field-free region.

4. The magnetic particle imaging apparatus according to claim 3, wherein
- the relative position of each of the retaining unit, the AC magnetic field application coil and the detection coil is fixed in the orthogonal direction.

5. The magnetic particle imaging apparatus according to claim 1, further comprising:
- a first driving unit configured to move only the retaining unit in the circumferential direction;
- a second driving unit configured to move only the retaining unit in the extending direction of the axis;
- a third driving unit configured to move the retaining unit, the first driving unit, the AC magnetic field application coil and the detection coil in the orthogonal direction as an integral structure; and
- a controller configured to control each of the first driving unit, the second driving unit and the third driving unit independently.

6. The magnetic particle imaging apparatus according to claim 1, wherein
- the AC magnetic field application coil and the detection coil are disposed coaxially.

7. The magnetic particle imaging apparatus according to claim 6, wherein
- the axis is orthogonal to the magnetic field-free region.

8. The magnetic particle imaging apparatus according to claim 1, wherein
- the detection coil includes a plurality of coil units arranged at intervals in the extending direction of the axis, and
- the plurality of coil units are electrically symmetrical to each other with respect to a center of the AC magnetic field application coil.

9. The magnetic particle imaging apparatus according to claim 1, wherein the AC magnetic field application coil is a Helmholtz coil.

10. The magnetic particle imaging apparatus according to claim 1, further comprising:

an image generator configured to correct an intensity of the signal acquired by the detection coil based on a sensitivity distribution of the detection coil and generate an image from the corrected signal.

11. The magnetic particle imaging apparatus according to claim 1, wherein the static magnetic field generator includes two permanent magnets arranged in such a manner that the same magnetic poles face each other.

12. The magnetic particle imaging apparatus according to claim 2, further comprising:

a first driving unit configured to move only the retaining unit in the circumferential direction;

a second driving unit configured to move only the retaining unit in the extending direction of the axis, a third driving unit configured to move the retaining unit, the first driving unit, the AC magnetic field application coil and the detection coil in the orthogonal direction as an integral structure; and a controller configured to control each of the first driving unit, the second driving unit and the third driving unit independently.

13. The magnetic particle imaging apparatus according to claim 4, further comprising:

a first driving unit configured to move only the retaining unit in the circumferential direction;

a second driving unit configured to move only the retaining unit in the extending direction of the axis;

a third driving unit configured to move the retaining unit, the first driving unit, the AC magnetic field application coil and the detection coil in the orthogonal direction as an integral structure; and a controller configured to control each of the first driving unit, the second driving unit and the third driving unit independently.

14. The magnetic particle imaging apparatus according to claim 2, wherein the AC magnetic field application coil and the detection coil are disposed coaxially.

15. The magnetic particle imaging apparatus according to claim 3, wherein the AC magnetic field application coil and the detection coil are disposed coaxially.

16. The magnetic particle imaging apparatus according to claim 4, wherein the AC magnetic field application coil and the detection coil are disposed coaxially.

17. The magnetic particle imaging apparatus according to claim 5, wherein the AC magnetic field application coil and the detection coil are disposed coaxially.

18. The magnetic particle imaging apparatus according to claim 14, wherein the axis is orthogonal to the magnetic field-free region.

19. The magnetic particle imaging apparatus according to claim 15, wherein the axis is orthogonal to the magnetic field-free region.

20. The magnetic particle imaging apparatus according to claim 16, wherein the axis is orthogonal to the magnetic field-free region.

* * * * *